(12) United States Patent
Van Gennip et al.

(10) Patent No.: US 8,536,768 B2
(45) Date of Patent: Sep. 17, 2013

(54) SYSTEM FOR HEAT CONDUCTION BETWEEN TWO CONNECTABLE MEMBERS

(75) Inventors: Wouter Van Gennip, Eindhoven (NL); Isabel R. L. Van De Weyenberg, Paal (BE); Jos G. A. Brunner, Eksel (BE)

(73) Assignee: Koninklijke Philips N.V., Eindhoven (NL)

( * ) Notice: Subject to any disclaimer, the term of this patent is extended or adjusted under 35 U.S.C. 154(b) by 204 days.

(21) Appl. No.: 13/123,724

(22) PCT Filed: Oct. 7, 2009

(86) PCT No.: PCT/IB2009/054387
§ 371 (c)(1),
(2), (4) Date: Apr. 12, 2011

(87) PCT Pub. No.: WO2010/044011
PCT Pub. Date: Apr. 22, 2010

(65) Prior Publication Data
US 2011/0187258 A1    Aug. 4, 2011

(30) Foreign Application Priority Data
Oct. 14, 2008 (EP) .................................. 08166569

(51) Int. Cl.
*H01J 1/02* (2006.01)
*H01J 7/24* (2006.01)
*H01J 61/52* (2006.01)
*H01K 1/58* (2006.01)

(52) U.S. Cl.
USPC .............................................. 313/46; 313/11

(58) Field of Classification Search
USPC ................. 313/46, 11, 45; 165/185; 257/99; 362/294, 373
See application file for complete search history.

(56) References Cited

U.S. PATENT DOCUMENTS

| | | |
|---|---|---|
| 3,075,030 A | 1/1963 | Elm et al. |
| 4,363,087 A | 12/1982 | Graham et al. |
| 4,419,722 A | 12/1983 | Bury |
| 4,478,588 A | 10/1984 | Lockard |
| 4,507,718 A | 3/1985 | Bury |
| 4,727,648 A | 3/1988 | Savage, Jr. |

(Continued)

FOREIGN PATENT DOCUMENTS

| | | |
|---|---|---|
| DE | 1151324 | 7/1963 |
| DE | 8130102 U1 | 3/1982 |

(Continued)

OTHER PUBLICATIONS

Machine Translation to English of JP 2001044506 A Feb. 2001.*

(Continued)

*Primary Examiner* — Mariceli Santiago
*Assistant Examiner* — Glenn Zimmerman
(74) *Attorney, Agent, or Firm* — Mark L. Beloborodov

(57) ABSTRACT

A system for detachably connecting a first member (1) to a second member (2). The first member (1) comprises a portion (4) that is surrounded by a portion (5) of the second member (2). Said portions (4,5) have surfaces of heat conductive materials for contacting each other in order to transfer heat between the two members (1,2). The coefficient of thermal expansion of the material of the surrounded portion (4) of the first member (1) is larger than the coefficient of thermal expansion of the material of the surrounding portion (5) of the second member (2).

13 Claims, 3 Drawing Sheets

(56) References Cited

U.S. PATENT DOCUMENTS

| | | |
|---|---|---|
| 4,897,769 A | 1/1990 | Lang |
| 5,121,311 A | 6/1992 | Cheselske |
| 5,594,433 A | 1/1997 | Terlep |
| 5,669,703 A | 9/1997 | Wheeler et al. |
| 5,754,407 A | 5/1998 | Kohno |
| 5,931,577 A | 8/1999 | Ishibashi |
| 6,338,647 B1 | 1/2002 | Fernandez et al. |
| 6,504,096 B2 | 1/2003 | Okubora |
| 6,582,100 B1 | 6/2003 | Hochstein et al. |
| 6,764,347 B1 | 7/2004 | Plishner |
| 6,816,389 B1 | 11/2004 | Lutz et al. |
| 6,824,390 B2 | 11/2004 | Brown et al. |
| 7,150,553 B2 | 12/2006 | English et al. |
| 2001/0002963 A1* | 6/2001 | Haje et al. .................. 403/30 |
| 2005/0181651 A1* | 8/2005 | Matsumura ................. 439/259 |
| 2006/0050514 A1 | 3/2006 | Opolka |
| 2006/0262544 A1 | 11/2006 | Piepgras et al. |
| 2007/0093143 A1* | 4/2007 | Nomura ....................... 439/751 |
| 2008/0188100 A1* | 8/2008 | Saitoh ............................ 439/82 |
| 2009/0154166 A1* | 6/2009 | Zhang et al. ................. 362/294 |

FOREIGN PATENT DOCUMENTS

| | | |
|---|---|---|
| DE | 102006002443 A1 | 7/2006 |
| EP | 1552983 A1 | 7/2005 |
| EP | 1976358 A2 | 10/2008 |
| GB | 859005 | 1/1961 |
| JP | 2001044506 A * | 2/2001 |

OTHER PUBLICATIONS

Thermal Expansion of the Elements http://www.periodictable.com/Properties/A/ThermalExpansion.an.html no date.*

* cited by examiner

SYSTEM FOR HEAT CONDUCTION BETWEEN TWO CONNECTABLE MEMBERS

FIELD OF THE INVENTION

The invention relates to a system for detachably connecting a first member to a second member, the first member comprising a portion that is surrounded by a portion of the second member when the two members are connected with each other, said portions having surfaces of heat conducting material for contacting each other in order to transfer heat between the two members.

BACKGROUND OF THE INVENTION

The system can be used for any detachable connection where heat has to be transferred between two interconnected members, but in particular such a system can be used for detachably connecting a LED lamp with a socket for the LED lamp. The expression "LED lamp" is used in this specification for a lamp comprising one or more light emitting diodes (LEDs) and a base portion or plug, wherein the base portion can be connected with a socket for holding the LED lamp.

Such a system is disclosed in US-A-2006/0050514. This publication describes a LED lamp having the shape of a conventional incandescent lamp. The lamp comprises a pear-shaped bulb enclosing a LED. The base portion of the lamp has a metal outer surface, which surface is provided with screw thread. The base portion can be screwed in a corresponding socket, being a lamp holder provided with a metal inner surface having screw thread. The heat generated by the LED and by its driving circuit is transferred through the base portion of the lamp to the metal inner surface of the socket.

SUMMARY OF THE INVENTION

LEDs are often attached to a printed circuit board (PCB) by soldering, such that a metal surface of the base portion of the LED contacts a portion of the PCB that can absorb heat generated by the LED. However, there is a need for a detachable connection of a LED lamp to a PCB or another carrier of the LED lamp, so that the LED lamp can be replaced, for example by a LED lamp having another color or a LED lamp having another light intensity. In particular in the case of bright light LEDs, the heat transfer capacity must be relatively high, requiring a relatively large contact area, or robust contact between the base portion of the LED lamp and the socket to which the LED lamp is connected.

An object of the invention is to provide a system for detachably connecting a first member to a second member, the first member comprising a portion that is surrounded by a portion of the second member when the two members are connected with each other, said portions having metal surfaces for contacting each other in a highly heat conducting manner in order to transfer heat between the two members.

Another object of the invention is to provide a system for detachably connecting a LED lamp with a socket, such that a metal surface of the base portion of the LED lamp makes highly heat conducting contact with a corresponding metal surface of the socket.

In order to achieve one or both of these objects, the coefficient of thermal expansion of the material of the surrounded portion of the first member is larger than the coefficient of thermal expansion of the material of the surrounding portion of the second member, so that the metal surfaces are pressed against each other when said portions are heated up. Thereby, the heat conduction between the two members is significantly increased. A part of the mutually contacting surfaces can be said metal surfaces, but preferably, all of the contacting surfaces of both said portions are made of metal. Preferably the two surfaces have a mutual contact area that is as large as possible, which is promoted by making the contact surfaces of the first and the second member mutually corresponding and snugly fitting. The surfaces, for example, can have the shape of a rectangular, square, circularly cylindrical body or of a body of revolution of a branch of a parabola. The occurrence of spacings/cavities in between the two members should be counteracted as much as possible, for example in that the surfaces are smooth or for example in that the surfaces are made of soft material and therefore are excellently suited to conform to irregular surfaces. Such a soft material is for example thermal management foil material 6003 series from MAJR with a Shore A hardness of 10±2, a thickness in the range of 0.13-15 mm, and a thermal conductivity of 2.2 W/mK, which is applicable at temperatures in the range of −50 to +220° C. Soft metal-like materials are Woods metal having a melting point of about 70° C., InCuBi-alloy having a melting point of 58° C., Gallium, Indium, Indalloy 1E, Indalloy 117. These metal-compounds all have melting points in the range of 30° C. to 200° C. and, due to their softness, adapt to the imposed surface structure and thus ensure good thermal contact.

The materials of the two members can for example be any metal or metal alloy, metal paste or metal-alloy paste like Galinstan, including a metal matrix composite, that has an appropriate coefficient of thermal expansion. For example, the material of the surrounded portion of the first member is aluminum, having a coefficient of linear thermal expansion of about $23 \times 10^{-6}$ per degree K at 20° C., and the material of the surrounding portion of the second member is copper, having a coefficient of linear thermal expansion of about $17 \times 10^{-6}$ per degree K at 20° C. Preferably, the difference in coefficient of linear thermal expansion of the two materials is more than $3 \times 10^{-6}$ per degree K at 20° C., more preferably more than $6 \times 10^{-6}$ per degree K at 20° C. to further promote close contact between the first member and the second member. The surfaces preferably are made of metal, as metals are comparatively easy to work with, readily available, and simultaneously enable electrical contact to be established between the two members.

Alternatively, non-metallic materials such as silicon rubbers, Coolpoly®, silicon carbide impregnated with silicon, or EPDM (ethylene-propylene-diene terpolymer) filled with SiC, Al2O3, or BN are applicable as heat conductive material.

All heat conductive materials preferably have a thermal conductivity of at least 1 W/mK to promote easy cooling, more preferably the heat conductivity is at least 2.5 W/mK up to 10 W/mK or even higher to make them excellently suitable for high power applications in which relatively much heat is generated.

In a preferred embodiment, said surrounded portion of the first member comprises a tapering outer surface, and said surrounding portion of the second member comprises a corresponding tapering inner surface, which surfaces contact each other when the members are connected with each other. Tapering means that the cross sectional dimension of the surrounded portion of the first member and of the surrounding portion of the second member decreases in the direction in which the surrounded portion is inserted in the surrounding portion.

Preferably, both surfaces have a matching conical shape or a frusto-conical shape, so that the two members can be interconnected in any rotational position with respect to each other. In a preferred embodiment, the apex angle of the two tapering surfaces is relatively small, so that the two portions stay one inside the other due to friction between the tapering surfaces of both portions. To this end, the apex angle preferably is between 5° and 45°, more preferably between 10° and 15°. The apex angle is the largest angle between two straight lines on the tapering surface.

The base portion can be fixed in the socket by friction of the contacting surfaces only. However, in a preferred embodiment, releasable fixation means are present for keeping the first member and the second member connected with each other. Such fixation means may be a bayonet connection or a screw thread connection, but in a preferred embodiment, said releasable fixation means comprise a so-called snap connection, comprising an elastic element attached to one of the members, which elastic element engages behind a corresponding element of the other member when the two members are interconnected. This is a simple connection means, enabling the two members to be interconnected in different rotational positions with respect to each other when the surfaces of the two portions are conical. This simplifies the operation for interconnecting the two members.

Preferably, said releasable fixation means comprise an elastic element attached to one of the members, preferably the first member, and engaging a corresponding element of the other member.

In a preferred embodiment, one of the members is a LED lamp. Even in the case of a relatively small difference of the coefficients of thermal expansion, there will be intensive heat-conducting contact between two metal surfaces as soon as said portions of the members are heated up. Therefore, the base portion of the LED lamp and the socket to which that base portion is connected can be relatively small. For example, the surrounded portion can be made of an alloy comprising mainly copper and aluminum, and the surrounding portion can be made of an alloy comprising mainly copper, so that an appropriate difference in coefficients of thermal expansion is achieved.

In a preferred embodiment, the first member comprising the surrounded portion is the LED lamp and the second member comprising the surrounding portion is a socket for the LED lamp. The LED lamp can be provided with a base portion forming a plug, and the socket can be provided with a hole corresponding to the plug, so that the plug can be inserted into the hole of the socket.

Apart from heat-conducting contact between the LED lamp and the socket, there is also electrically conductive contact in order to supply electric power to the LED lamp. Electric contact elements may be integrated in the heat-conductive contact surfaces as is the case in the system described in US-A-2006/0050514. In a preferred embodiment of the invention, the LED lamp comprises two electric contact elements contacting two corresponding electric contact elements of the socket when the LED lamp and the socket are connected with each other.

The invention is also related to a LED lamp comprising a base portion having a metal outer surface for contacting a corresponding metal inner surface of a socket in order to transfer heat from the LED lamp to the socket, the metal outer surface having a tapering shape, and the cross sectional dimension of the outer surface decreasing in the direction away from the LED of the LED lamp.

The invention is furthermore related to a socket comprising a metal inner surface for contacting a corresponding metal outer surface of the base portion of a LED lamp, the metal inner surface having a tapering shape, and the cross sectional dimension of the inner surface decreasing in the direction in which the LED lamp has to be inserted into the socket.

BRIEF DESCRIPTION OF THE DRAWINGS

The invention will now be further elucidated by means of a description of an embodiment of a LED lamp and a socket for that LED lamp, wherein reference is made to the drawing comprising diagrammatic Figures, wherein.

The Figures are schematic representations, only showing parts that contribute to the elucidation of the described embodiment.

DETAILED DESCRIPTION OF AN EMBODIMENT

Figure 1:
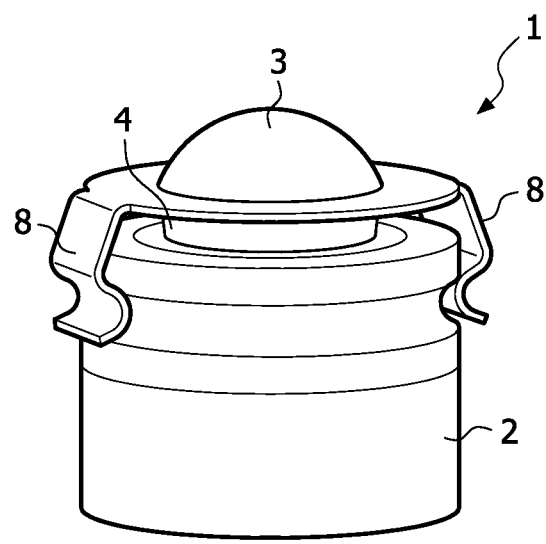
FIG. 1 is a perspective view of a LED lamp in its socket.
Figure 2:
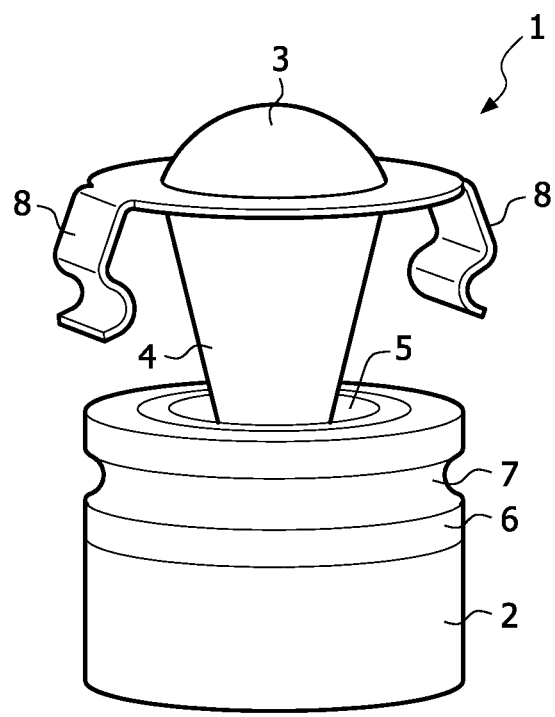
FIG. 2 is a view in which the LED lamp is lifted from the socket.

FIGS. 1 and 2 show a LED lamp 1 and a socket 2 being the lamp holder for the LED lamp 1. The LED lamp 1 comprises a LED 3 and a base portion or plug 4. The plug 4 has a conical shape and is made of aluminum. The conical outer surface of plug 4 fits in a corresponding conical inner surface 5 (see FIG. 2) of socket 2. The socket is made of copper and is provided with a plastic ring 6 having a circumferential groove 7. The conical outer surface of plug 4 contacts the conical inner surface 5 of the socket 2 when the plug 4 is inserted into the socket 2. When the plug 4 is heated up, the expansion of the plug 4 is larger than the expansion of the socket 2, because of the difference of the coefficients of thermal expansion of the material of the plug 4 and the material of the socket 2.

The LED lamp 1 comprises two elastic elements 8, which elements 8 can cooperate with the groove 7 of the plastic ring 6 of the socket 2, so that the plug 4 is kept in the socket 2. FIG. 1 shows the LED lamp 1 in a somewhat lifted position with respect to the socket 2, and FIG. 2 shows the LED lamp 1 in a further lifted position.

Figure 3:
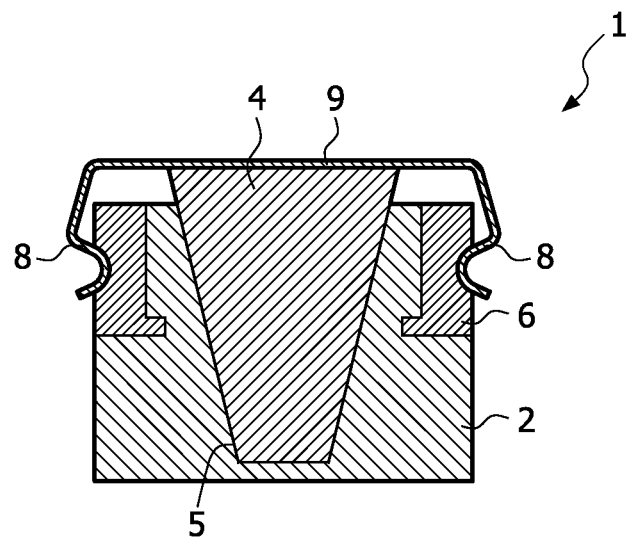
FIG. 3 is a sectional view of the plug of the LED lamp and the socket.
Figure 4:
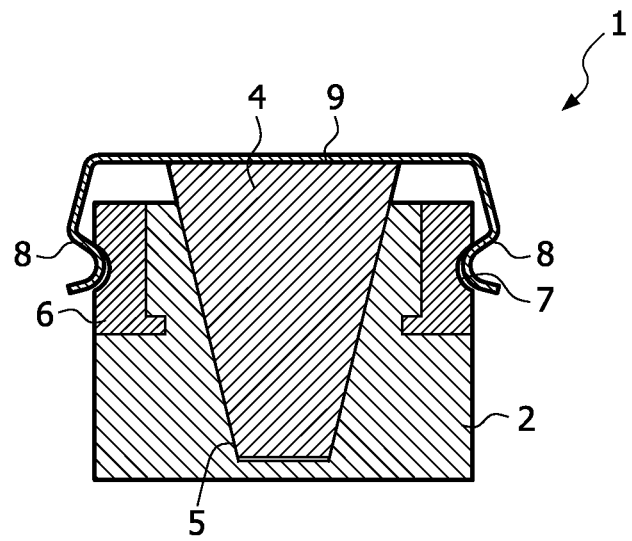
FIG. 4 shows the plug somewhat lifted from the socket.
Figure 5:
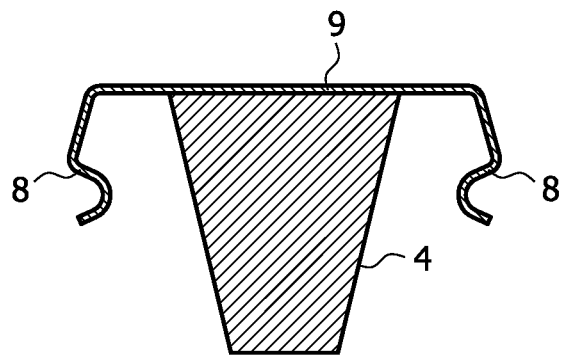
FIG. 5 is a sectional view of the plug.
Figure 6:
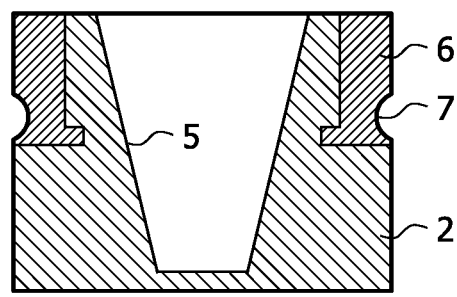
FIG. 6 is a sectional view of the socket.

FIGS. 3-5 are schematic sectional views of the plug 4 of the LED lamp 1 and the socket 2. FIG. 3 shows the plug 4 completely inserted into the socket 2 and FIG. 4 shows the position where the plug 4 is somewhat lifted from the socket 2, corresponding to FIG. 1. On top of the plug 4 is a metal member 9 having the two elastic elements 8. Member 9 is welded on the plug 4 and carries on its top side the LED 3, which LED 3 is not represented in FIGS. 3-5.

The contact elements for supplying electric current to the LED are not represented in the Figures. These contact elements can be integrated in the two elastic elements 8 and in the plastic ring 6.

The socket 2 can be attached to a printed circuit board (PCB) by soldering or screwing, so that the lower metal surface of the socket 2 contacts a portion of the PCB that can absorb heat generated by the LED. The heat generated by the LED is transferred through the plug 4 and the material of the socket 2 to the PCB.

While the invention has been illustrated in the drawing and the foregoing description, such illustration and description are to be considered illustrative or exemplary and not restrictive; the invention is not limited to the disclosed embodiment. The mere fact that certain measures are recited in mutually different dependent claims does not indicate that a combination of these measures cannot be used to advantage. Any reference signs in the claims should not be construed as limiting the scope of the invention.

The invention claimed is:

1. A system for detachably connecting a first member to a second member, the first member comprising a portion that is surrounded by a portion of the second member, when the two members are connected with each other, said portions having surfaces made at least partly of heat conductive material for contacting each other in order to transfer heat between the two members, wherein the coefficient of thermal expansion of the material of the surrounded portion of the first member is larger than the coefficient of thermal expansion of the material of the surrounding portion of the second member, so that the surfaces of the first and the second members are pressed against each other when said portions are heated up, wherein said surrounded portion of the first member comprises a tapering outer surface, and in that said surrounding portion of the second member comprises a corresponding tapering inner surface, which the outer and the inner surfaces have a conical shape and contact each other when the members are connected with each other.

2. A system as claimed in claim 1, wherein said surfaces are made completely of said heat conductive material.

3. A system as claimed in claim 1, wherein said heat conductive material comprises a metal.

4. A system as claimed in claim 1, wherein the apex angle of said tapering surfaces is between 5° and 45°.

5. A system as claimed in claim 1, further comprising releasable fixation means for keeping the first member and the second member connected with each other.

6. A system as claimed in claim 5, wherein said releasable fixation means comprise an elastic element attached to one of the members and engaging a corresponding element of the other member.

7. A system as claimed in claim 1, wherein one of the members is a LED lamp.

8. A system as claimed in claim 7, wherein the first member is the LED lamp and the second member comprises a socket for the LED lamp.

9. A LED lamp for use in a system as claimed in claim 8, comprising a base portion having a metal outer surface for contacting a corresponding metal inner surface of a socket in order to transfer heat from the LED lamp to the socket, wherein the metal outer surface has a tapering shape, and the cross sectional dimension of the outer surface decreases in the direction away from the LED of the LED lamp.

10. A system as claimed in claim 1, wherein the apex angle of said tapering surfaces is between 10° and 15°.

11. A system for detachably connecting a first member to a second member, the first member comprising a portion that is surrounded by a portion of the second member when the two members are connected with each other, said portions having surfaces made at least partly of heat conductive material for contacting each other in order to transfer heat between the two members, wherein the coefficient of thermal expansion of the material of the surrounded portion of the first member is larger than the coefficient of thermal expansion of the material of the surrounding portion of the second member, so that the surfaces of the first and the second members are pressed against each other when said portions are heated up, and further comprising releasable fixation means for keeping the first member and the second member connected with each other, wherein said releasable fixation means comprise an elastic element attached to one of the members and engaging a corresponding element of the other member.

12. A system as claimed in claim 11, wherein one of the members is a LED lamp.

13. A system as claimed in claim 12, wherein the first member is the LED lamp and the second member comprises a socket for the LED lamp.

\* \* \* \* \*